(12) United States Patent
Phan et al.

(10) Patent No.: US 7,741,205 B2
(45) Date of Patent: Jun. 22, 2010

(54) INTEGRATED CIRCUIT HAVING A TOP SIDE WAFER CONTACT AND A METHOD OF MANUFACTURE THEREFOR

(75) Inventors: Tony Thanh Phan, Flower Mound, TX (US); William C Loftin, Plano, TX (US); John Lin, Chelmsford, MA (US); Philip L Hower, Concord, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/016,443

(22) Filed: Jan. 18, 2008

(65) Prior Publication Data
US 2008/0132066 A1 Jun. 5, 2008

Related U.S. Application Data

(62) Division of application No. 11/195,283, filed on Aug. 2, 2005, now Pat. No. 7,345,343.

(51) Int. Cl.
*H01L 21/768* (2006.01)
(52) U.S. Cl. ............................... 438/597; 257/E21.575
(58) Field of Classification Search ................. 438/672, 438/618, 622, 637, 597, 584, 669; 257/347, 257/E21.537, E21.538, E21.575
See application file for complete search history.

(56) References Cited

U.S. PATENT DOCUMENTS

| 5,940,705 | A  | * | 8/1999  | Lee et al. ..................... 438/258 |
| 6,429,099 | B1 | * | 8/2002  | Christensen et al. ......... 438/480 |
| 6,613,834 | B2 | * | 9/2003  | Nakata et al. ................ 524/588 |
| 7,199,050 | B2 | * | 4/2007  | Hiatt .......................... 438/667 |
| 7,262,109 | B2 | * | 8/2007  | Lin et al. ..................... 438/405 |
| 7,465,639 | B1 | * | 12/2008 | Pelella et al. ................ 438/384 |

* cited by examiner

*Primary Examiner*—Matthew Smith
*Assistant Examiner*—Michele Fan
(74) *Attorney, Agent, or Firm*—Warren L. Franz; Wade J. Brady, III; Frederick J. Telecky, Jr.

(57) ABSTRACT

The present invention provides an integrated circuit and a method of manufacture therefore therefor. The integrated circuit (100, 1000), in one embodiment without limitation, includes a dielectric layer (120, 1020) located over a wafer substrate (110, 1010), and a semiconductor substrate (130, 1030) located over the dielectric layer (120, 1020), the semiconductor substrate (130, 1030) having one or more transistor devices (140, 1040) located therein or thereon. The integrated circuit (100, 1000) may further include an interconnect (170, 1810) extending entirely through the semiconductor substrate (130, 1030) and the dielectric layer (120, 1020), thereby electrically contacting the wafer substrate (110, 1010).

13 Claims, 9 Drawing Sheets

INTEGRATED CIRCUIT HAVING A TOP SIDE WAFER CONTACT AND A METHOD OF MANUFACTURE THEREFOR

This application is a divisional application of application Ser. No. 11/195,283 filed on Aug. 2, 2005 (now pending) entitled Integrated Circuit Having a Top Side Wafer Contact and a Method of Manufacture Therefor.

TECHNICAL FIELD OF THE INVENTION

The present invention is directed, in general, to a wafer contact and, more specifically, to an integrated circuit having a top side wafer contact and a method of manufacture therefore.

BACKGROUND OF THE INVENTION

Silicon-on-insulator (SOI) technology is becoming of increasing importance in the field of integrated circuits. SOI technology deals with the formation of transistors in a layer of semiconductor material that overlies an insulating layer. A common embodiment of SOI structures is a single crystal layer of silicon that overlies a layer of silicon dioxide.

High performance and high-density integrated circuits are generally achievable using SOI technology because of the reduction of parasitic elements present in integrated circuits formed in bulk semiconductor. For example, for a MOS transistor formed in bulk, parasitic capacitance is present at the junction between the source/drain regions and the underlying substrate, and the possibility of breakdown of the junction between source/drain regions and the substrate regions also exists. A further example of parasitic elements is present for CMOS technology in bulk, where parasitic bipolar transistors formed by n-channel and p-channel transistors in adjacent wells can give rise to latch-up problems. Since SOI structures significantly alleviate parasitic elements, and increase the junction breakdown tolerance of the structure, the SOI technology is well suited for high performance (e.g., analog devices) and high-density integrated circuits.

However, the underlying insulator film in an SOI structure presents certain problems relative to the transistor performance. For instance, noise and coupling capacitance associated with the SOI structure tends to degrade the transistor performance. In an attempt to reduce or alleviate the aforementioned noise and coupling capacitance issues, the industry uses a backside wafer contact. Unfortunately, the backside wafer contact currently employed uses costly lead frames and/or down bonding techniques that are typically relegated to the transistor die perimeter.

Accordingly, what is needed is a backside contact and method for manufacture therefor that does not experience the drawbacks of the conventional backside contacts.

SUMMARY OF THE INVENTION

To address the above-discussed deficiencies of the prior art, the present invention provides an integrated circuit and a method of manufacture therefore. The integrated circuit, in one embodiment without limitation, includes a dielectric layer located over a wafer substrate, and a semiconductor substrate located over the dielectric layer, the semiconductor substrate having one or more transistor devices located therein or thereon. The integrated circuit may further include an interconnect extending entirely through the semiconductor substrate and the dielectric layer, thereby electrically contacting the wafer substrate.

As briefly mentioned above, the present invention is also directed to a method for manufacturing an integrated circuit. In addition to certain other steps, the method for manufacturing the integrated circuit may include providing a stack of layers including a wafer substrate, a dielectric layer located over the wafer substrate, and a semiconductor substrate located over the dielectric layer, the semiconductor substrate having one or more transistor devices located therein or thereon, and forming an interconnect that extends entirely through the semiconductor substrate and the dielectric layer, thereby electrically contacting the wafer substrate.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying drawings. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
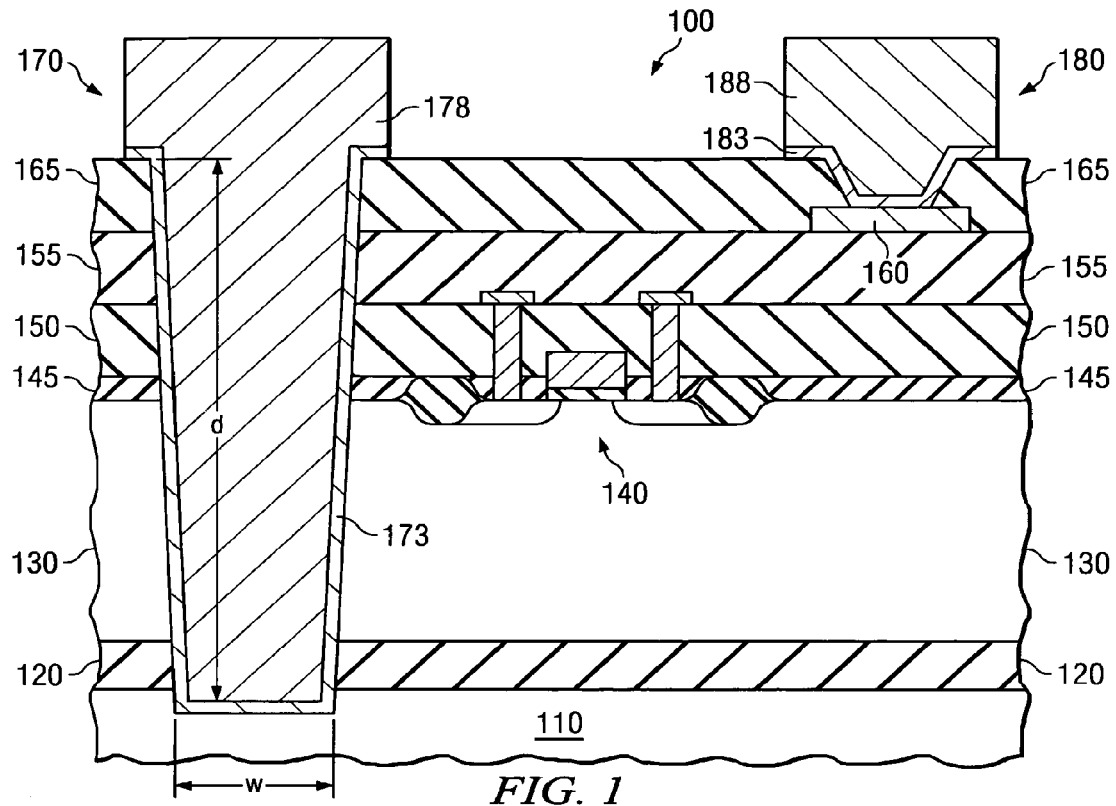
FIG. 1 illustrates a cross-sectional view of an integrated circuit that has been manufactured in accordance with the principles of the present invention.

Referring initially to FIG. 1, illustrated is a cross-sectional view of an integrated circuit 100 that has been manufactured in accordance with the principles of the present invention. The integrated circuit 100 illustrated in FIG. 1 initially includes a dielectric layer 120, such as a buried oxide layer (e.g., silicon dioxide), located over a wafer substrate 110. Conventionally located over the dielectric layer 120 is a semiconductor substrate 130. The semiconductor substrate 130, among other materials, may comprise single crystal silicon.

The collection of the wafer substrate 110, dielectric layer 120, and the semiconductor substrate 130 is often referred to as a silicon-on-insulator (SOI) structure. It should be apparent, however, that even though the SOI structure of FIG. 1 is illustrated and described as having certain features, the invention to be disclosed herein is applicable to all forms of SOI including stacked as well as single layer structures. Hence, this invention applies to transistor devices built on all forms of SOI including, for example, heteroepitaxy, such as SOS, beam recrystallization, epitaxial lateral overgrowth, lateral solid phase epitaxy, and single silicon separation (e.g. SIMOX and FIPOS).

Conventionally located on or in the semiconductor substrate 130 are one or more transistor devices 140. As is illustrated, each of the one or more transistor devices 140 may have standard features, such as a gate structure, source/drain regions, isolation structures, as well as transistor device level contacts contacting one or more of those features. Conventionally located over the transistor devices 140, as least in the embodiment of FIG. 1, may be a tetraethyl orthosilicate (TEOS) layer 145.

Additionally located over the transistor devices 140 may be one or more interlevel dielectric layers 150, 155. The interlevel dielectric layers 150, 155 may comprise any material currently used or hereafter discovered while staying within the scope of the present invention. In one exemplary embodiment of the present invention, one or all of the interlevel dielectric layers 150, 155, comprise a low dielectric constant (k) material. As used herein, a low dielectric constant (k) material is a material having a dielectric constant (k) less than silicon dioxide, and thus a dielectric constant (k) of less than about 3.9. Suitable low dielectric constant (k) materials include, among others, OSG, BPSG, PSG, TEOS, aerogel, xerogel, HSQ, MSQ or any other low dielectric constant materials. Nevertheless, the dielectric layers 150, 155, may comprise other non-low dielectric constant (k) materials and remain within the scope of the present invention.

At this point in the description of the integrated circuit 100 of FIG. 1, it should be mentioned that even though the illustrative embodiment shows only two interlevel dielectric layers 150, 155, other embodiments exist wherein more or fewer than two interlevel dielectric layers 150, 155 are used. For example, in the majority of embodiments more than two interlevel dielectric layers 150, 155 are used. For instance, it is often common for there to be from about 10 to about 14 interlevel dielectric layers 150, 155, in any given integrated circuit. While not shown, each of these interlevel dielectric layer 150, 155, typically has an associated metal level.

Located over the uppermost interlevel dielectric layer 155 in the embodiment of FIG. 1 is a top metal feature 160. Further located over the top metal feature 160 is a protective overcoat layer 165. As those skilled in the art appreciate, the protective overcoat layer 165 may comprise a variety of different materials while staying within the scope of the present invention.

Uniquely positioned extending entirely through the semiconductor substrate 130 and the dielectric layer 120, thereby electrically contacting the wafer substrate 110 is an interconnect 170. In the given embodiment of FIG. 1, the interconnect 170 not only extends entirely through the semiconductor substrate 130 and the dielectric layer 120, but it additionally extends entirely through the one or more interlevel dielectric layers 150, 155, and the protective overcoat layer 165. Accordingly, the interconnect 170 functions as a top side wafer substrate 110 contact.

While not limited to such, the interconnect 170 may include an intermediate layer 173 and a conductive plug 178. The intermediate layer 173, as one might expect, is designed to provide a diffusion barrier between the conductive plug 178 and the layers through which the interconnect 170 extends. Additionally, in certain instances the intermediate layer 173 provides electrical isolation between the conductive plug 178 and the layers through which the interconnect 170 extends. In other embodiments, the intermediate layer 173 functions as a seed layer for the later formation of the conductive plug 178. For example, in the given embodiment wherein the conductive plug 178 is copper, the intermediate layer 173 could comprise a titanium/tungsten seed layer.

In the given embodiment wherein the interconnect 170 extends through the protective overcoat layer 165, the interlevel dielectric layers 150, 155, the semiconductor substrate 130, the dielectric layer 120 and into the wafer substrate 110, the interconnect 170 might have a depth (d) into the integrated circuit 100 ranging from about 2 µm to about 15 µm. In an exemplary embodiment, the interconnect 170 might have a depth (d) into the integrated circuit 100 ranging from about 9 µm to about 11 µm. Additionally, such a depth (d) might cause a base width (w) of the interconnect 170 to range from about 2 µm to about 20 µm.

Also located over the protective overcoat layer 165, adjacent to the interconnect 170 in the embodiment of FIG. 1, is a top metal contact 180, which is configured to contact the top metal feature 160. As is illustrated, the top metal contact 180 may comprise an intermediate layer 183 and a conductive plug 188. While not limited to such, the intermediate layer 183 and the conductive plug 188 may comprise the same materials as the intermediate layer 173 and conductive plug 178, respectively. This is often the case because the intermediate layers 173, 183, and the conductive plugs 178, 188, respectively, are formed in the same processing steps.

The integrated circuit 100 illustrated in FIG. 1 having the interconnect 170 experiences many benefits over conventional structures. For instance, the interconnect 170 contacting the wafer substrate 110 is not relegated to the edge of the wafer, as conventional lead frame structures were. Accordingly, the interconnect 170 may be positioned at any desired location in the integrated circuit 100. Furthermore, the manufacture of the interconnect 170 may be easily added to conventional process flows, thus it is less time-consuming and expensive, all the while providing the ability to bias the wafer substrate 110 to decrease noise and coupling capacitance.

Figure 2:
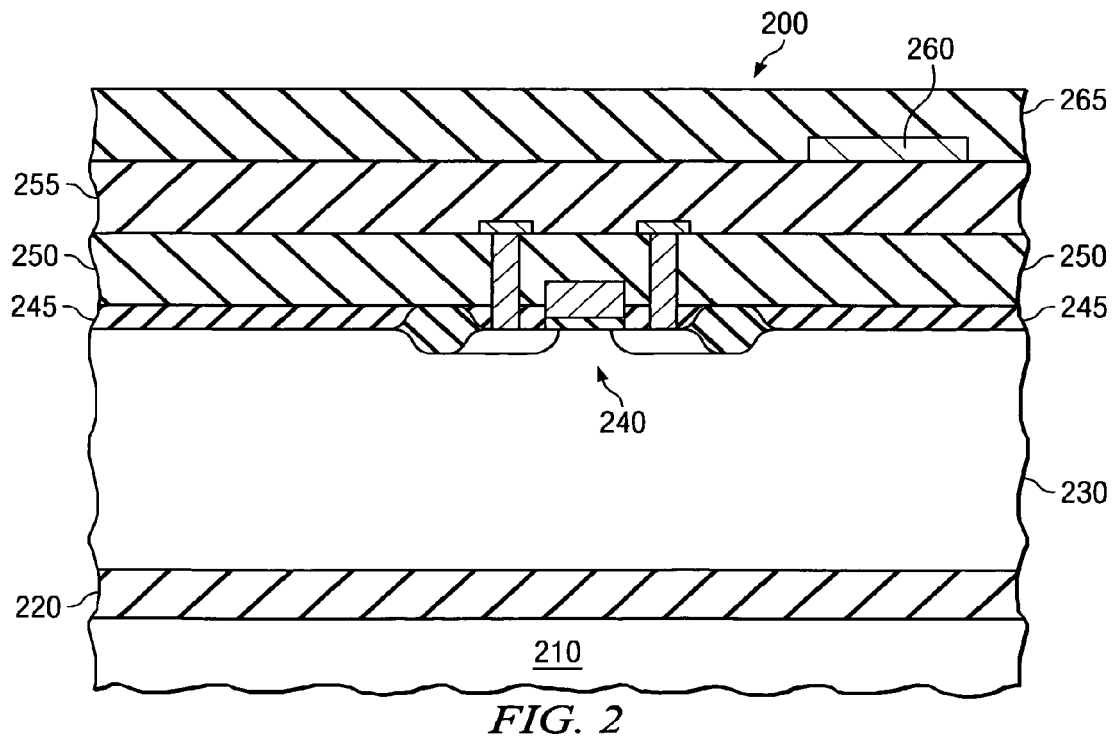
FIG. 2 illustrates a cross-sectional view of a partially completed integrated circuit.

Turning now to FIGS. 2-9, illustrated are cross-sectional views of detailed manufacturing steps instructing how one might, in an advantageous embodiment, manufacture an integrated circuit similar to the integrated circuit 100 depicted in FIG. 1. FIG. 2 illustrates a cross-sectional view of a partially completed integrated circuit 200. The partially completed integrated circuit 200 of FIG. 2 includes a wafer substrate 210. The wafer substrate 210 may comprise a variety of different substrates while staying within the scope of the present invention. Nevertheless, in the current example, the wafer substrate 210 is a conventional p-type or n-type doped substrate that was obtained from a standard silicon ingot. While the thickness of the wafer substrate 210 is generally unimportant to the inventive aspects of the present invention, certain embodiments exist wherein the thickness of the wafer substrate 210 ranges from about 600 µm to about 700 µm.

Located over the wafer substrate 210 in the embodiment of FIG. 2 is a dielectric layer 220. The dielectric layer 220, similar to the wafer substrate 210, may comprise a variety of different materials while staying within the scope of the present invention. In the embodiment of FIGS. 2-9, however, the dielectric layer 220 comprises a buried oxide layer, such as a buried silicon dioxide layer.

Those skilled in the art understand the process for manufacturing the dielectric layer 220. In one embodiment the dielectric layer 220 is formed by depositing or growing the dielectric layer 220 to a thickness ranging from about 50 nm to about 1500 nm. In another embodiment, however, the thickness of the dielectric layer 220 might range from about 100 nm to about 500 nm. Nonetheless, the present invention should not be limited to the aforementioned materials or thicknesses.

Located over the dielectric layer 220 in the embodiment of FIGS. 2-9 is a semiconductor substrate 230. The semiconductor substrate 230 happens to be single crystal silicon, but other well-known or hereafter discovered materials may also be used. Accordingly, the present invention should not be limited to any specific material for the semiconductor substrate 230.

Similar to many of the other layers within the partially completed integrated circuit 200, the thickness of the semiconductor substrate 230 is generally unimportant to the inventive aspects of the present invention. Nevertheless, the semiconductor substrate 230 illustrated in FIGS. 2-9 may have a thickness ranging from about 7.5 µm to about 8.5 µm, with a preferred range between about 7.9 µm and about 8.1 µm. These ranges, while not governed by the inventive aspects of the present invention, are generally governed by other design criteria of the integrated circuit 200.

Optionally located in a lower portion of the semiconductor substrate 230 may be a device under field (DUF) structure (not shown). The DUF structure basically consists of a heavily doped region in the semiconductor substrate 230, for example heavily doped with boron or antimony. As those skilled in the art are aware, the DUF is configured to reduce collector resistance.

Located in or on the semiconductor substrate 230 in the embodiment of FIG. 2 is a transistor device 240. Those skilled in the art appreciate that while only one transistor device 240 is illustrated in the discussed embodiments, in virtually all instances a significant number of transistor devices 240 will be used. As the transistor device 240 is conventional, no further detail as to its elements or its manufacture will be given.

Also, located over the transistor device 240 is a TEOS layer 245. The TEOS layer 245 may be conventionally manufactured to well-known thicknesses. For instance, the TEOS layer 245 may be conventionally deposited to a thickness ranging from about 80 nm to about 200 nm. Nevertheless, the present invention should not be limited to such manufacturing processes and thicknesses. Moreover, the novel aspects of the present invention would be equally applicable were the TEOS layer 245 not present.

Conventionally located over the transistor device 240 may be one or more interlevel dielectric layers 250, 255. The interlevel dielectric layers 250, 255, as those skilled in the art are aware, are the surfaces upon which the various different metal levels in the integrated circuit 200 are formed. Only two interlevel dielectric layers 250, 255 are illustrated in the illustrative embodiments of FIGS. 2-9; however, the majority of embodiments will include more than two interlevel dielectric layers 250, 255, for example generally from about 10 to about 14 interlevel dielectric layers 250, 255. Thus, any number of interlevel dielectric layers 250, 255 are within the purview of the present invention.

The interlevel dielectric layers 250, 255, as one would expect in today's integrated circuits, may and generally do consist of a low dielectric constant (k) material. OSG is one well-known and commonly used low dielectric constant (k) material that is used for the interlevel dielectric layers 250, 255. However, other materials, whether low k or not, may also be used.

Positioned over the interlevel dielectric layers 250, 255 in the embodiment of FIGS. 2-9 is a top metal feature 260. The top metal feature 260 typically operates as a low resistance contact to the various devices therebelow in the integrated circuit 200. Among others, the top metal feature 260 may comprise copper.

The top metal feature 260, in the embodiment shown, is located below a protective overcoat layer 265. The protective overcoat layer 265 is generally configured to provide environmental, mechanical, electrical, etc. protection from outside influences. In the given embodiments, the protective overcoat layer 265 comprises a rigid material such as nitride, silicon nitride, silicon oxynitride, etc. However, the present invention should not be limited to such materials. The thickness of the protective overcoat layer 265, as those skilled appreciate, varies depending on the packaging of the integrated circuit 200. Nevertheless, one known embodiment has the protective overcoat layer 265 having a thickness ranging from about 1.0 μm to about 2.0 μm.

Figure 3:
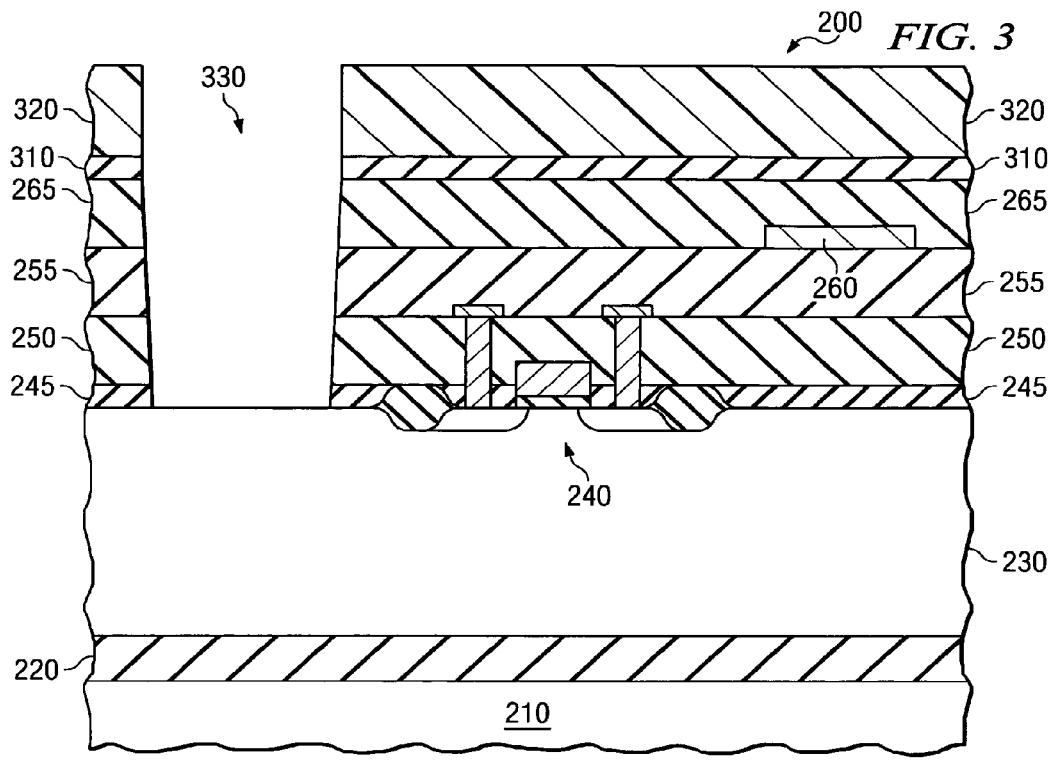
FIG. 3 illustrates a cross-sectional view of the partially completed integrated circuit illustrated in FIG. 2 after forming a hard mask layer over the protective overcoat layer, patterning the hard mask layer using a photoresist layer, and forming an opening using a suitable etch.

Turning now to FIG. 3, illustrated is a cross-sectional view of the partially completed integrated circuit 200 illustrated in FIG. 2 after forming a hard mask layer 310 over the protective overcoat layer 265, patterning the hard mask layer 310 using a photoresist layer 320, and forming an opening 330 through the layers 265, 255, 250, 245, using a suitable etch. The hard mask layer 310, which may comprise many different materials (one of which may be undoped silica glass (USG)) is used in a conventional manner to define a deep trench. For example, if photoresist alone were used, the thickness required for the photoresist might be unmanageable. Accordingly, the photoresist is used to define the opening in the hard mask layer 310, and then the hard mask layer 310 may be used to define the trench 330. The skilled artisan understands this process.

After defining the opening in the hard mask layer 310, the partially completed integrated circuit 200 may be subjected to a suitable etch. Depending on the materials used for the layers 265, 255, 255, 245, a single etch or multiple etches might be required to form the opening 330 illustrated in FIG. 3. In an exemplary embodiment, however, a single etch could be used to form the opening 330 illustrated in FIG. 3.

Figure 4:
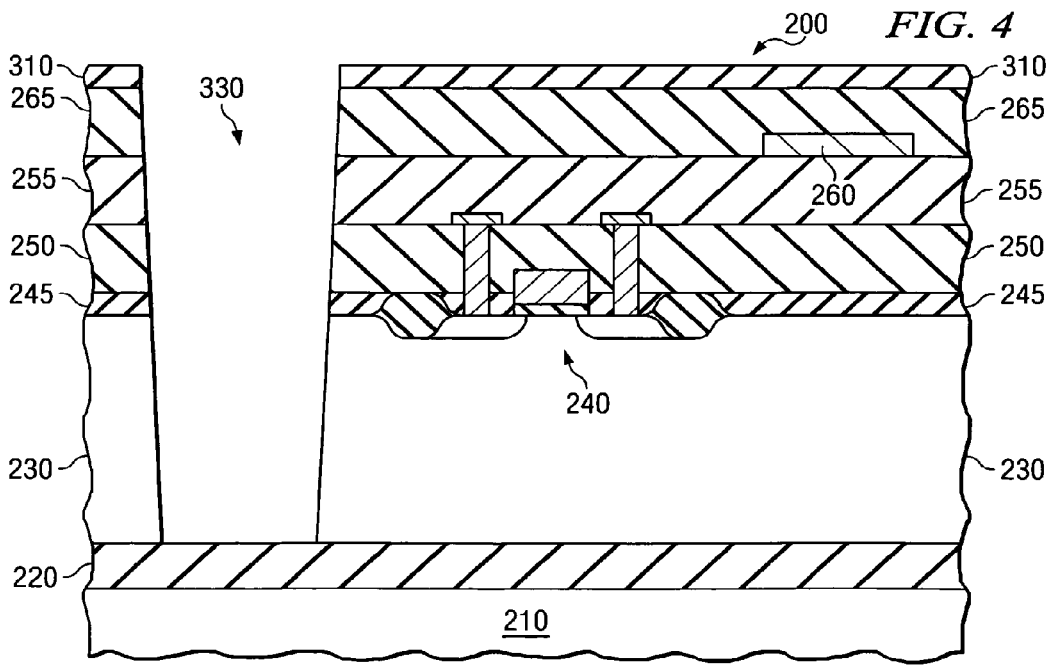
FIG. 4 illustrates a cross-sectional view of the partially completed integrated circuit illustrated in FIG. 3 after extending the opening through the semiconductor substrate.

Turning now to FIG. 4, illustrated is a cross-sectional view of the partially completed integrated circuit 200 illustrated in FIG. 3 after extending the opening 330 through the semiconductor substrate 230. Similar to the etch step associated with FIG. 3 above, the etchant used in FIG. 4 is chosen based upon its ability to etch the material of the layer it is etching. In this embodiment the etchant is chosen based upon its ability to etch the semiconductor substrate 230, which happens to be silicon, and more specifically single crystal silicon. Those skilled in the art understand the etch chemistries that could be used to etch the semiconductor substrate 230. In an exemplary embodiment, this etch is chosen to be selective to the semiconductor substrate 230 and not the dielectric layer 220, thus allowing the etch to stop on the dielectric layer 220.

Figure 5:
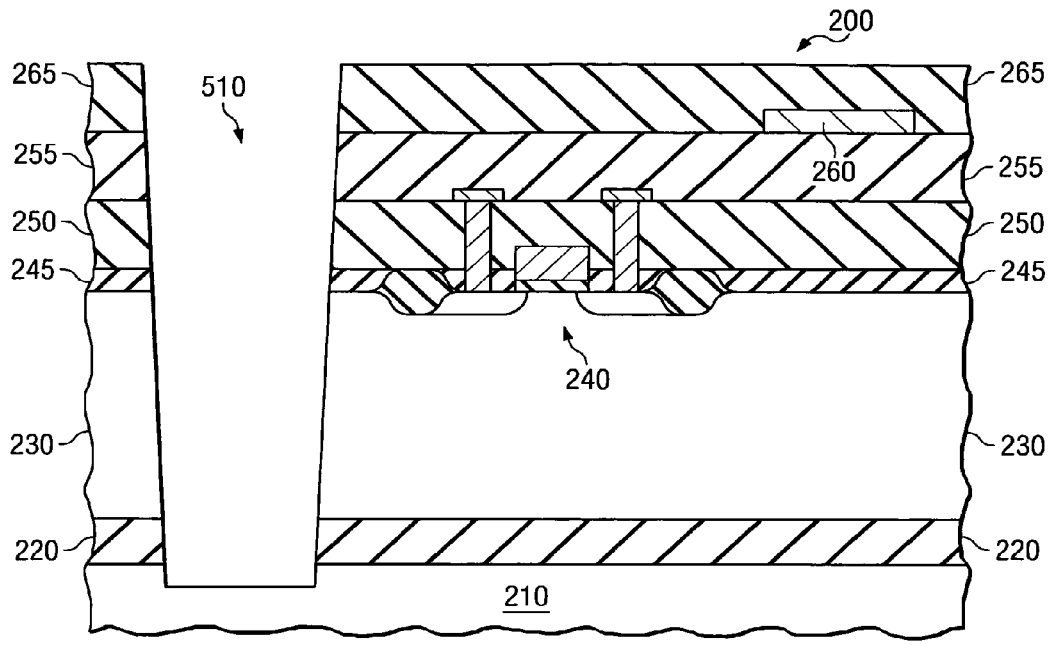
FIG. 5 illustrates a cross-sectional view of the partially completed integrated circuit illustrated in FIG. 4 after etching through the dielectric layer.

Turning now to FIG. 5, illustrated is a cross-sectional view of the partially completed integrated circuit 200 illustrated in FIG. 4 after etching through the dielectric layer 220. In the illustrative embodiment shown in FIG. 5, this etch advantageously etches into the wafer substrate 210. What results is a trench 510 that extends through the various layers 265, 255, 250, 245, 230, and 220 and then into the wafer substrate 210. Any etch capable of etching the dielectric layer 220 could be used.

Figure 6:
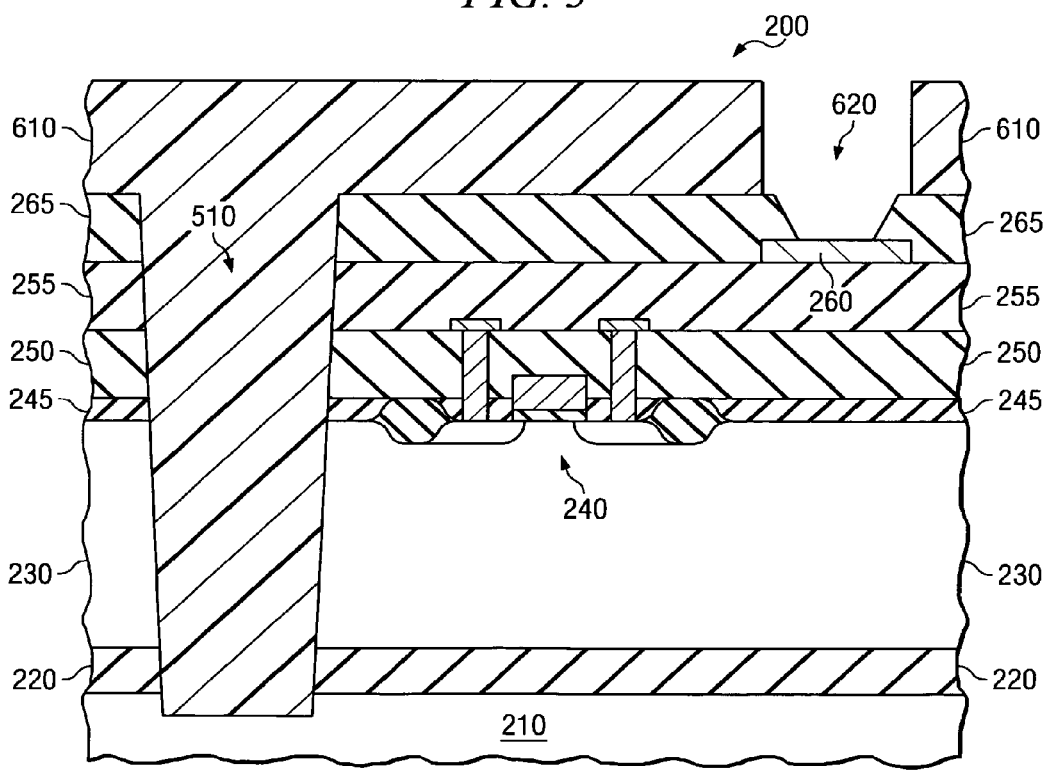
FIG. 6 illustrates a cross-sectional view of the partially completed integrated circuit illustrated in FIG. 5 after forming and patterning a photoresist layer over the protective overcoat layer to expose a region above the top metal feature, and etching the protective overcoat layer to form an opening in the protective overcoat layer and thereby expose the top metal feature.

Turning now to FIG. 6, illustrated is a cross-sectional view of the partially completed integrated circuit 200 illustrated in FIG. 5 after forming and patterning a photoresist layer 610 over the protective overcoat layer 265 to expose a region above the top metal feature 260, and etching the protective overcoat layer 265 to form an opening 620 in the protective overcoat layer 265, and thereby expose the top metal feature 260. As is illustrated, the patterned photoresist layer 610 is located within the trench 510, thus protecting the trench 510 from the etch used to form the opening 620. The skilled artisan will understand the processes that might be used to form and pattern the photoresist layer 610, and thereafter use the patterned photoresist layer 610 to etch the protective overcoat layer 265. Accordingly, no further detail is required.

Figure 7:
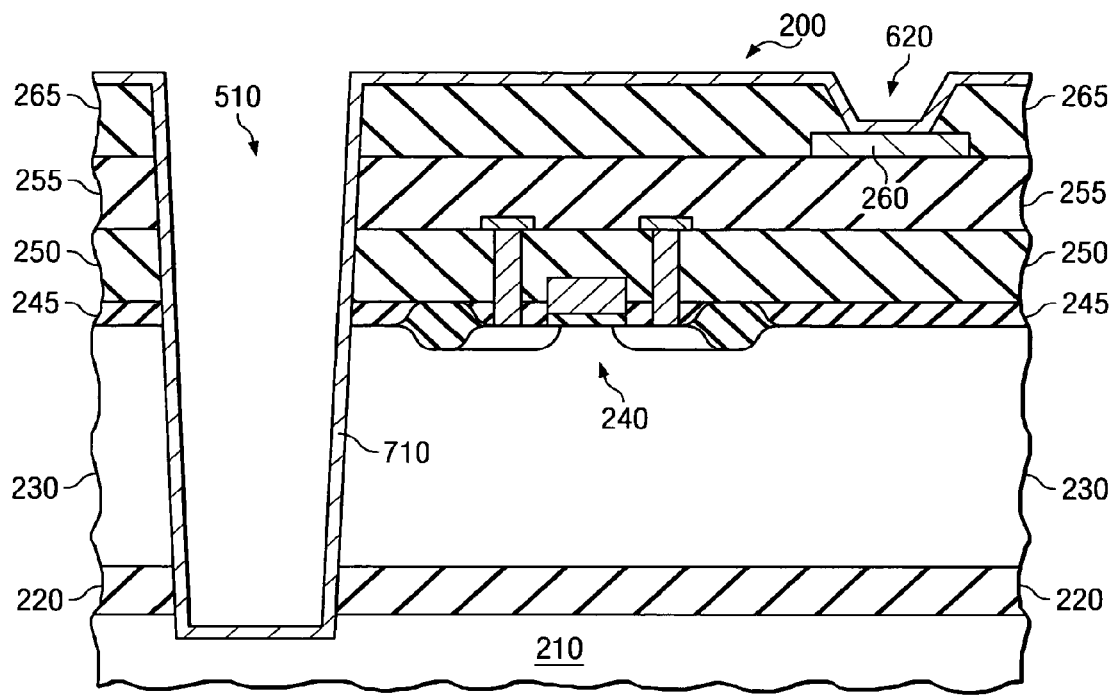
FIG. 7 illustrates a cross-sectional view of the partially completed integrated circuit illustrated in FIG. 6 after removal of the photoresist layer and the formation of an intermediate layer within the trench and the opening.

Turning now to FIG. 7, illustrated is a cross-sectional view of the partially completed integrated circuit 200 illustrated in FIG. 6 after removal of the photoresist layer 610 and the formation of an intermediate layer 710 within the trench 510 and the opening 620. As previously indicated with respect to the discussion of FIG. 1, the intermediate layer 710 may have various different purposes. Accordingly, the intermediate layer 710 may comprise many different materials and may have many different thicknesses. Nevertheless, in the embodiment discussed with respect to FIG. 7 the intermediate layer 710 comprises a titanium tungsten alloy seeding layer and has a thickness ranging from about 250 nm to about 350 nm. Other materials and thicknesses are, however, within the purview of the present invention.

Figure 8:
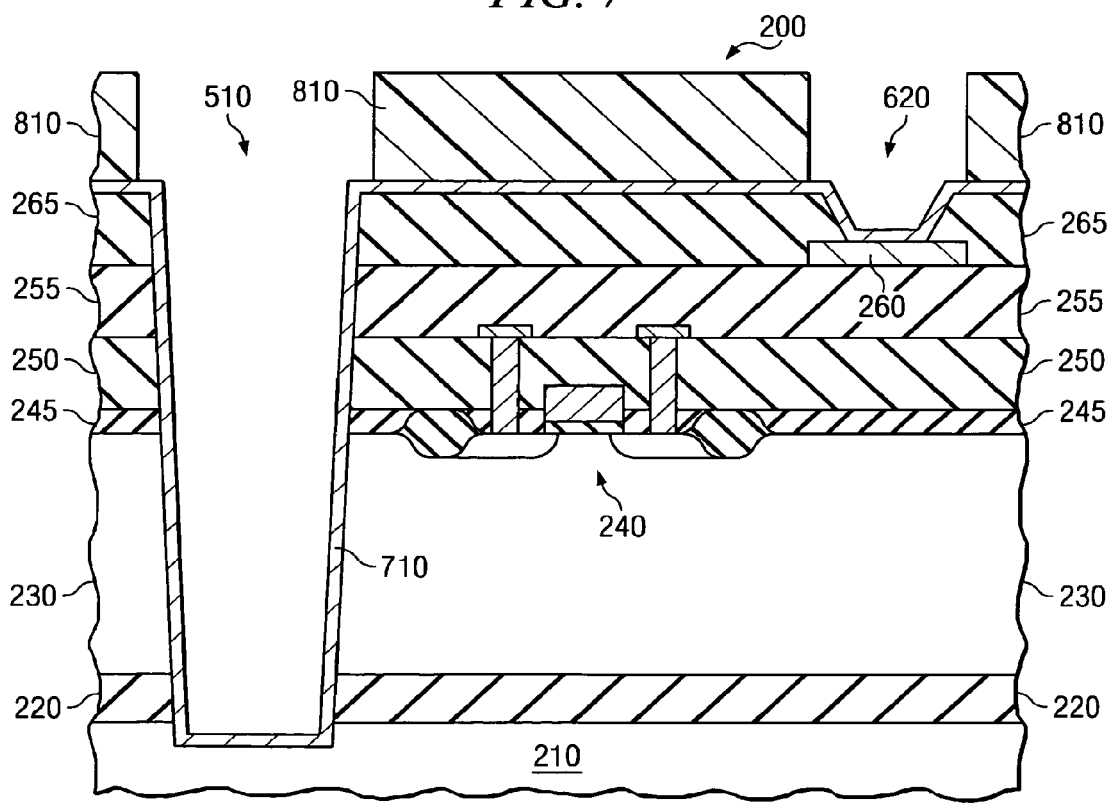
FIG. 8 illustrates a cross-sectional view of the partially completed integrated circuit illustrated in FIG. 7 after forming and patterning a photoresist layer thereover.

Turning now to FIG. 8, illustrated is a cross-sectional view of the partially completed integrated circuit 200 illustrated in FIG. 7 after forming and patterning a photoresist layer 810 thereover. As is illustrated, the patterned photoresist layer 810 has openings therein exposing the trench 510 and the opening 620. The skilled artisan will again understand the processes that might be used to form and pattern the photoresist layer 810. Accordingly, no further detail is required.

Figure 9:
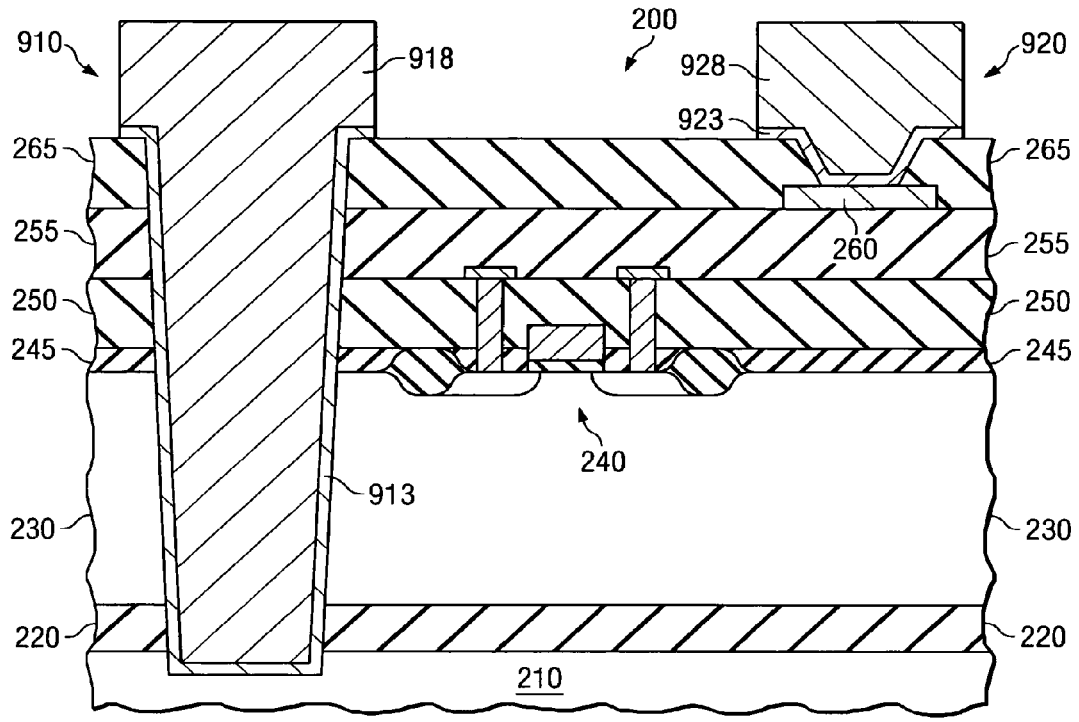
FIG. 9 illustrates a cross-sectional view of the partially completed integrated circuit illustrated in FIG. 8 after forming an interconnect and a top metal contact within the trench and opening, respectively.

Turning now to FIG. 9, illustrated is a cross-sectional view of the partially completed integrated circuit 200 illustrated in FIG. 8 after forming an interconnect 910 and a top metal contact 920 within the trench 510 and opening 620, respectively. In the given embodiment, the interconnect 910 and the top metal contact 920 were formed by placing the structure of FIG. 8 within a conventional copper electroplating solution. After the proper amount of electroplating had occurred, the structure was removed from the copper electroplating solution and the photoresist layer 810 then removed, resulting in conductive plugs 918, 928.

The conductive plugs 918, 928 electroplated over the intermediate layers 913, 923, respectively, thus resulting in the illustrated interconnect 910 and top metal contact 920. While the process described with respect to FIG. 9 is directed to an electroplating process, and more specifically a copper electroplating process, any known or hereafter discovered process could be substituted for the copper electroplating process, and thus be used to form the desired interconnect 910 and top metal contact 920.

Figure 10:
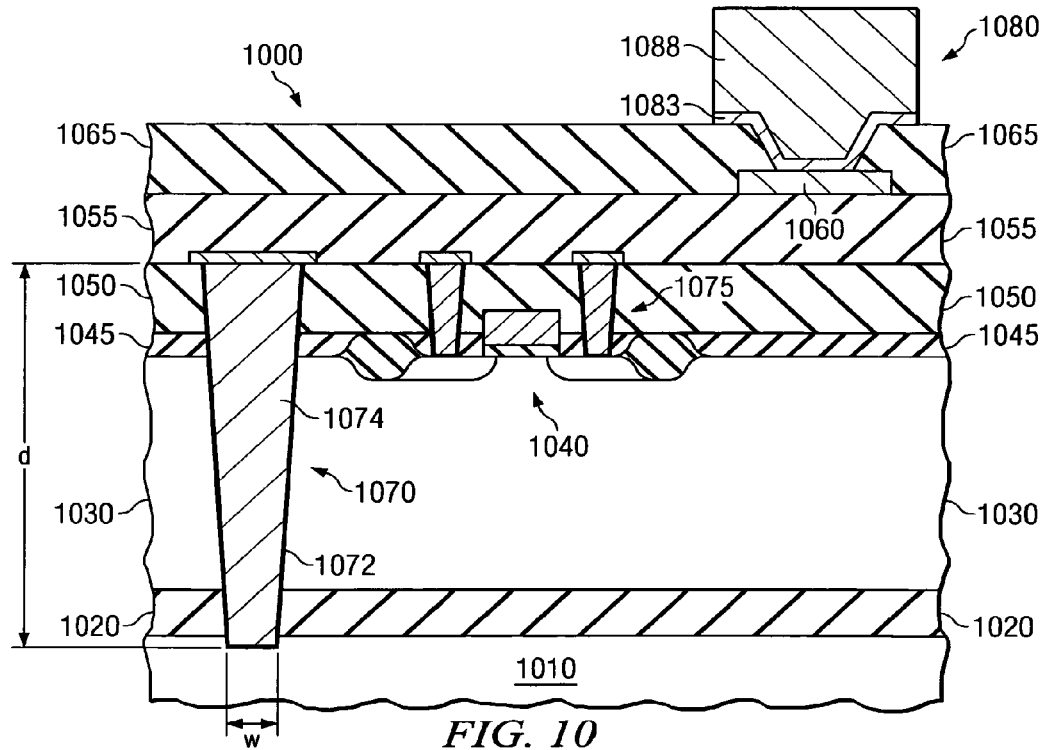
FIG. 10 illustrates a cross-sectional view of an alternative embodiment of an integrated circuit manufactured in accordance with the principles of the present invention.

Turning now to FIG. 10, illustrated is a cross-sectional view of an alternative embodiment of an integrated circuit 1000 manufactured in accordance with the principles of the present invention. The integrated circuit 1000 includes a wafer substrate 1010, a dielectric layer 1020, a semiconductor substrate 1030, one or more transistor devices 1040, a TEOS layer 1045, one or more interlevel dielectric layers 1050, 1055, a top metal feature 1060, a protective overcoat layer 1065, and a top metal contact 1080, which are substantially similar to the wafer substrate 110, the dielectric layer 120, the semiconductor substrate 130, the one or more transistor devices 140, the TEOS layer 145, the one or more interlevel dielectric layers 150, 155, the top metal feature 160, the protective overcoat layer 165, and the top metal contact 180, respectively, discussed above with respect to FIG. 1.

The embodiment of FIG. 10, however, rather than having the interconnect 170 that extends through each of the protective overcoat 165, the interlevel dielectric layer 150, 155, the semiconductor substrate 130 and the dielectric layer 120 into the wafer substrate 110, has its interconnect 1070 extend through the first interlevel dielectric layer 1050, the semiconductor substrate 1030 and the dielectric layer 1020 into the wafer substrate 1010. Accordingly, wherein the interconnect 170 is formed in the back end of the manufacturing process of the integrated circuit 100, the interconnect 1070 is formed more toward the front end of the manufacturing process of the integrated circuit 1000.

Other differences also exist between the interconnect 1070 and the interconnect 170. For instance, the interconnect 1070 may comprise a tungsten conductive plug 1074 formed over a titanium/titanium nitride intermediate layer 1072, which is different from the interconnect 170. Moreover, the interconnect 1070 may have substantially similar material layers as the materials included within the transistor level interconnect features 1075. This is in contrast to the interconnect 170 having substantially similar material layers as the top metal contact 180. Such differences are generally attributable to the different methods for manufacturing the interconnect 170 and the interconnect 1070.

While the integrated circuit 100 and the integrated circuit 1000 are noticeably different, those skilled in the art appreciate that the general teachings are the same. That is, each of the embodiments of FIGS. 1 and 10 illustrate an integrated circuit 100, 1000, having interconnects 170, 1070 that extend through a semiconductor substrate 130, 1030, and a dielectric layer 120, 1020, and into the wafer substrate 110, 1010, to electrically contact the wafer substrate 110, 1010. Accordingly, the decision to use one embodiment versus the other would generally be based upon the desires of the particular manufacturer of the integrated circuit, and whether one would want to manufacture it on the front end or back end of the manufacturing process.

Figure 11:
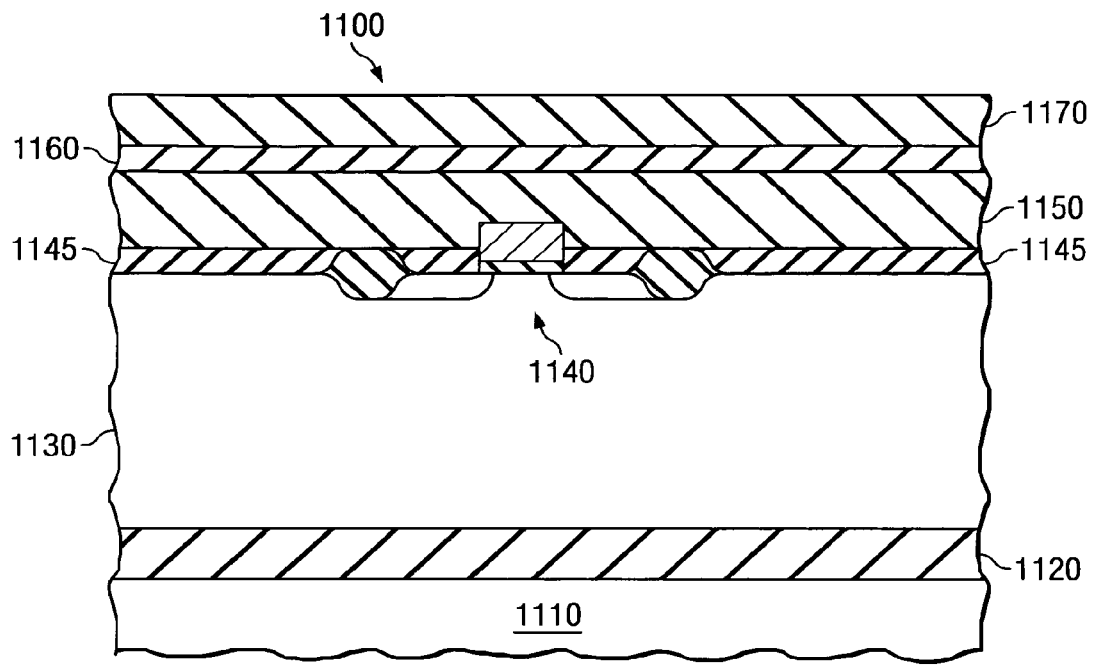
FIG. 11 illustrates a cross-sectional view of a partially completed integrated circuit.

Turning now to FIGS. 11-18, illustrated are cross-sectional views of detailed manufacturing steps instructing how one might, in an advantageous embodiment, manufacture an integrated circuit similar to the integrated circuit 1000 depicted in FIG. 10. FIG. 11 illustrates a cross-sectional view of a partially completed integrated circuit 1100. The partially completed integrated circuit 1100 of FIG. 11 includes a wafer substrate 1110, a dielectric layer 1120, a semiconductor substrate 1130, a transistor device 1140, a TEOS layer 1145, and an interlevel dielectric layer 1150, which may or may not be substantially similar to the wafer substrate 210, the dielectric layer 220, the semiconductor substrate 230, the transistor device 240, the TEOS layer 245, and the interlevel dielectric layer 250 illustrated in FIG. 2, respectively. The details of such layers may be obtained in the discussion above with respect to FIG. 2.

Positioned over the interlevel dielectric layer 1150 may be a protective layer 1160. The protective layer 1160 provides substantially the same etching advantages as the protective overcoat layer 265 illustrated in FIG. 2 above. For instance, the protective layer 1160, similar to the protective overcoat layer 265, may comprise a nitride or another similar material, and may thus help define subsequent openings. Without being limited to such, the protective layer 1160 may have a thickness ranging from about 200 nm to about 300 nm.

Positioned over the protective layer 1160 in the embodiment of FIG. 11 is a hard mask layer 1170. Again, the hard mask layer 1170 provides similar etching benefits as the hard mask layer 310 illustrated in FIG. 3. Because the hard mask layer 1170 and the hard mask layer 310 may have similar materials, thicknesses and purposes, and those features of the hard mask layer 310 are discussed in greater detail above, no further detail is warranted.

Figure 12:
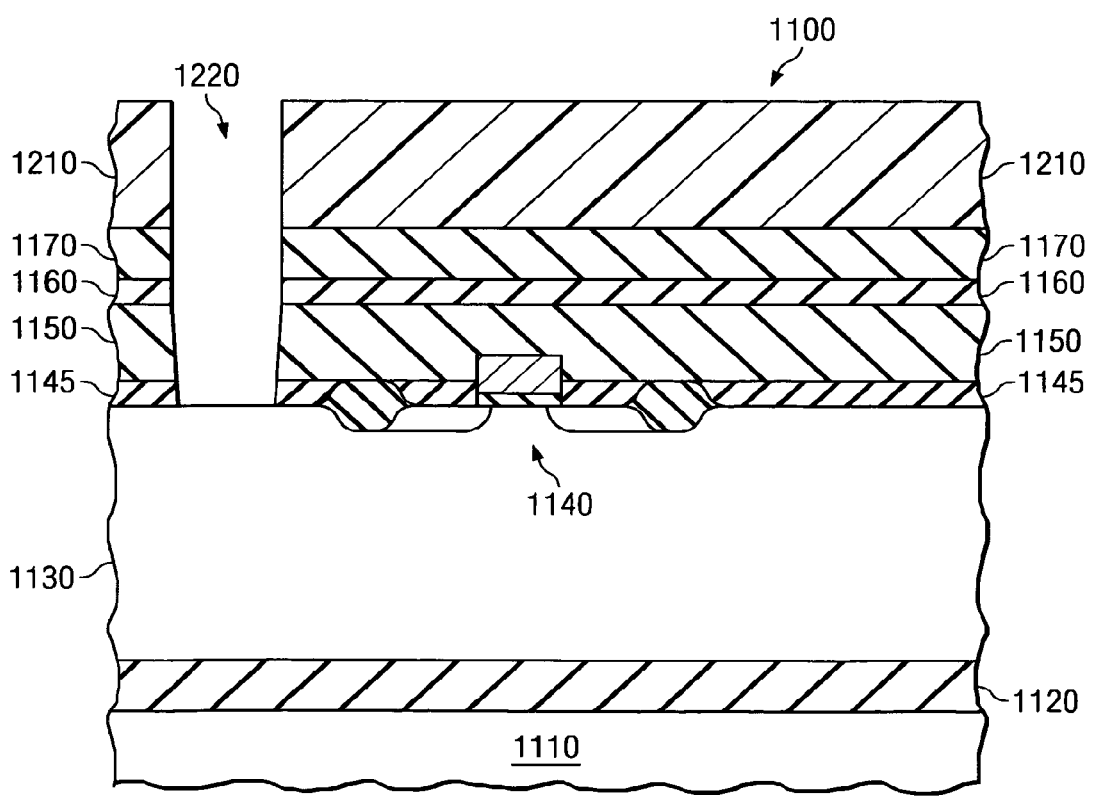
FIG. 12 illustrates a cross-sectional view of the partially completed integrated circuit illustrated in FIG. 11 after patterning the hard mask layer using a photoresist layer, and forming an opening through the exposed layers using a suitable etch.

Turning now to FIG. 12, illustrated is a cross-sectional view of the partially completed integrated circuit 1100 illustrated in FIG. 11 after patterning the hard mask layer 1170 using a photoresist layer 1210, and forming an opening 1220 through the layers 1170, 1160, 1150, 1145, using a suitable etch. Similar to above, and depending on the materials used for the layers 1170, 1160, 1150, 1145, a single etch or multiple etches might be required to form the opening 1220 illustrated in FIG. 12. In an exemplary embodiment, however, a single etch could be used to form the opening 1220 illustrated in FIG. 12.

Figure 13:
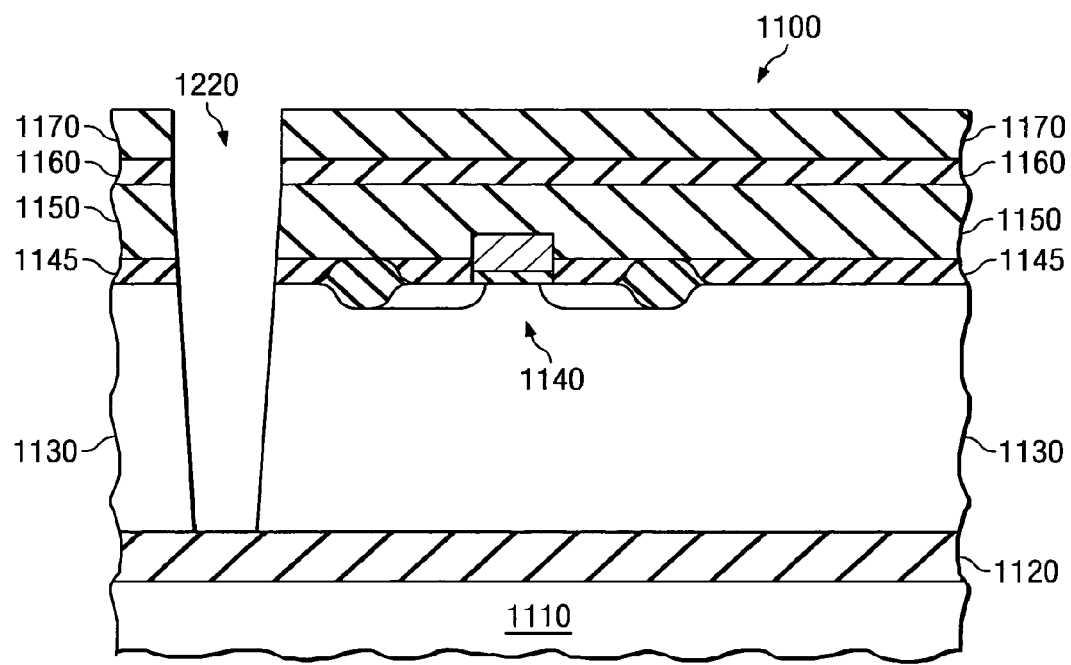
FIG. 13 illustrates a cross-sectional view of the partially completed integrated circuit illustrated in FIG. 12 after extending the opening through the semiconductor substrate.

Turning now to FIG. 13, illustrated is a cross-sectional view of the partially completed integrated circuit 1100 illustrated in FIG. 12 after extending the opening 1220 through the semiconductor substrate 1130. Notice how the etch stop layer 1170 is reduced in thickness. In certain embodiment it may be substantially, if not entirely, removed during this step. This etch is similar to the etch discussed above with respect to FIG. 4, thus, again no further detail is warranted.

Figure 14:
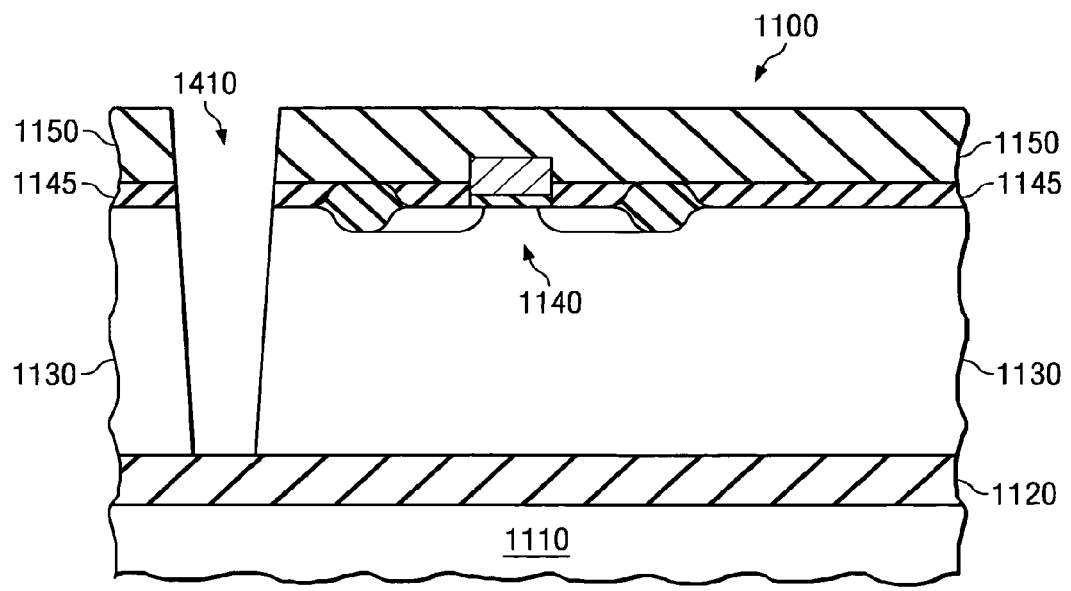
FIG. 14 illustrates a cross-sectional view of the partially completed integrated circuit illustrated in FIG. 13 after etching through the dielectric layer.

Turning now to FIG. 14, illustrated is a cross-sectional view of the partially completed integrated circuit 1100 illustrated in FIG. 13 after etching through the dielectric layer 1120. In the illustrative embodiment shown in FIG. 14, this etch advantageously etches into the wafer substrate 1110. What results is a trench 1410 that extends through the various layers 1150, 1145, 1130, and 1120 and then into the wafer substrate 1110. After finishing the trench 1410, any remaining hard mask layer 1170 or protective layer 1160 may be removed using conventional techniques.

Figure 15:
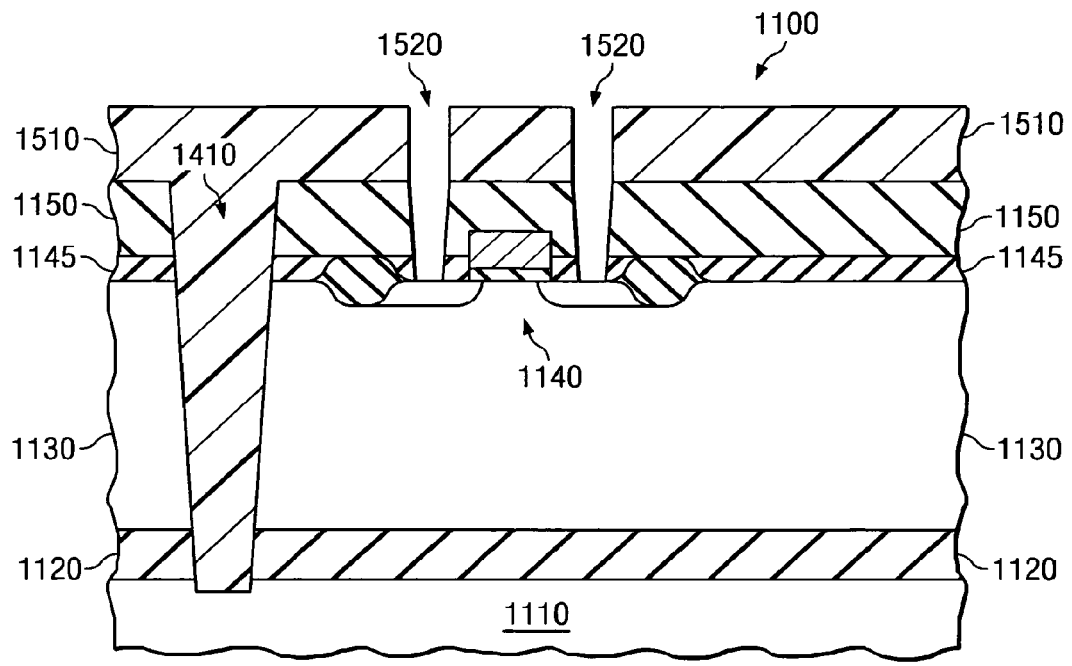
FIG. 15 illustrates a cross-sectional view of the partially completed integrated circuit illustrated in FIG. 14 after forming and patterning a photoresist layer over the interlevel dielectric layer to expose a region or regions above the transistor device, and etching the interlevel dielectric layer to form one or more openings in the interlevel dielectric layer.

Turning now to FIG. 15, illustrated is a cross-sectional view of the partially completed integrated circuit 1100 illustrated in FIG. 14 after forming and patterning a photoresist layer 1510 over the interlevel dielectric layer 1150 to expose a region or regions above the transistor device 1140, and etching the interlevel dielectric layer 1150 to form one or more openings 1520 in the interlevel dielectric layer 1150. As is illustrated, the openings 1520 expose features of the transistor device 1140. As is illustrated, the patterned photoresist layer 1510 is located within the trench 1410, thus protecting the trench 1410 from the etch used to form the openings 1520. The skilled artisan will understand the processes that might be used to form and pattern the photoresist layer 1510, and thereafter using the patterned photoresist layer 1510 to etch the interlevel dielectric layer 1150. Accordingly, no further detail is required.

Figure 16:
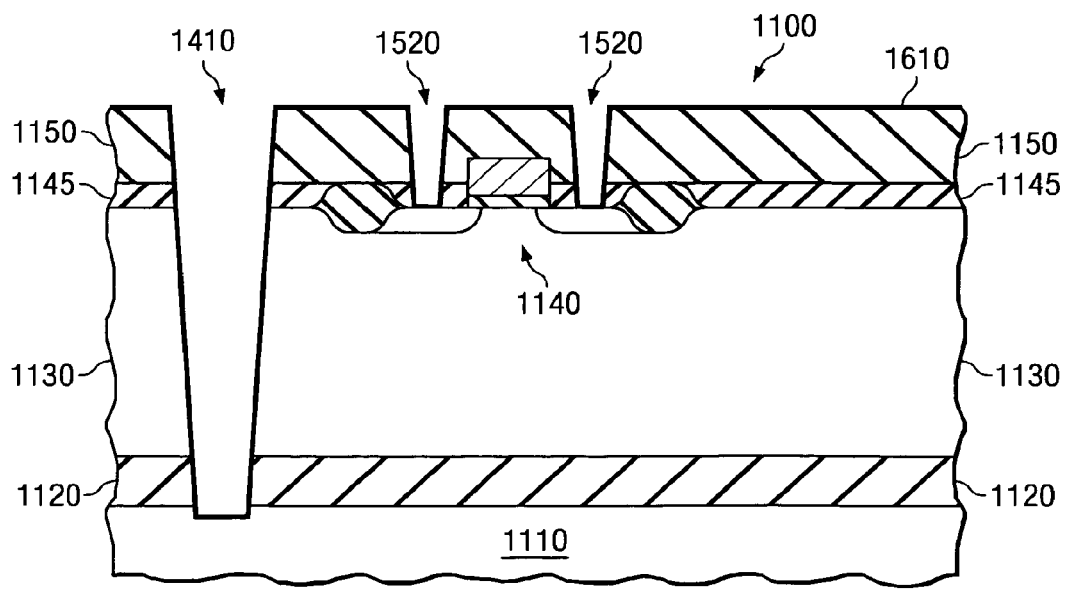
FIG. 16 illustrates a cross-sectional view of the partially completed integrated circuit illustrated in FIG. 15 after removal of the photoresist layer and the formation of an intermediate layer within the trench and the openings.

Turning now to FIG. 16, illustrated is a cross-sectional view of the partially completed integrated circuit 1100 illustrated in FIG. 15 after removal of the photoresist layer 1510 and the formation of an intermediate layer 1610 within the trench 1410 and the openings 1520. As previously indicated with respect to the discussion of FIG. 1, the intermediate layer 1610 may have various different purposes. Accordingly, the intermediate layer 1610 may comprise many different materials and may have many different thicknesses. Nevertheless, in the embodiment discussed with respect to FIG. 16, the intermediate layer 1610 comprises a titanium/titanium nitride barrier layer and has a thickness ranging from about 10 nm to about 60 nm. Other materials and thicknesses are, however, within the purview of the present invention.

Figure 17:
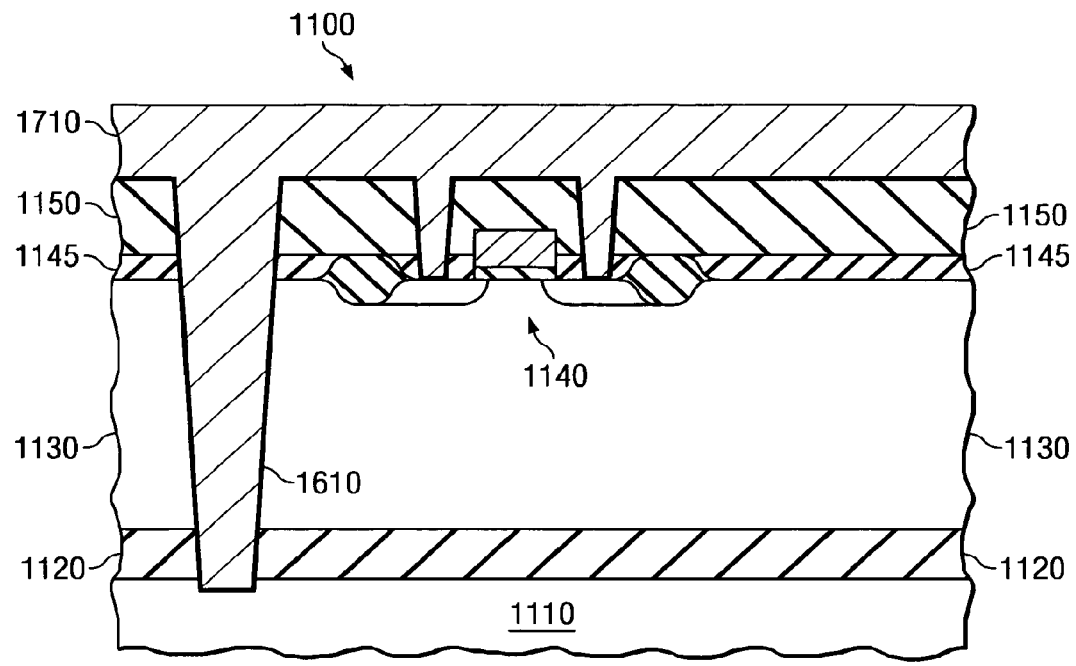
FIG. 17 illustrates a cross-sectional view of the partially completed integrated circuit illustrated in FIG. 16 after depositing a blanket layer of conductive material within the trench and the openings.

Turning now to FIG. 17, illustrated is a cross-sectional view of the partially completed integrated circuit 1100 illustrated in FIG. 16 after depositing a blanket layer of conductive material 1710 within the trench 1410 and the openings 1520. A variety of different conductive materials may be used for the blanket layer of conductive material 1710; however, the embodiment shown and discussed with respect to FIG. 17 uses a blanket layer of tungsten material. Tungsten, in this embodiment, was chosen for its ability to easily and completely fill the trench 1410 and openings 1520. It goes without saying, however, that other conductive materials could be used for the blanket layer of conductive material 1710.

Figure 18:
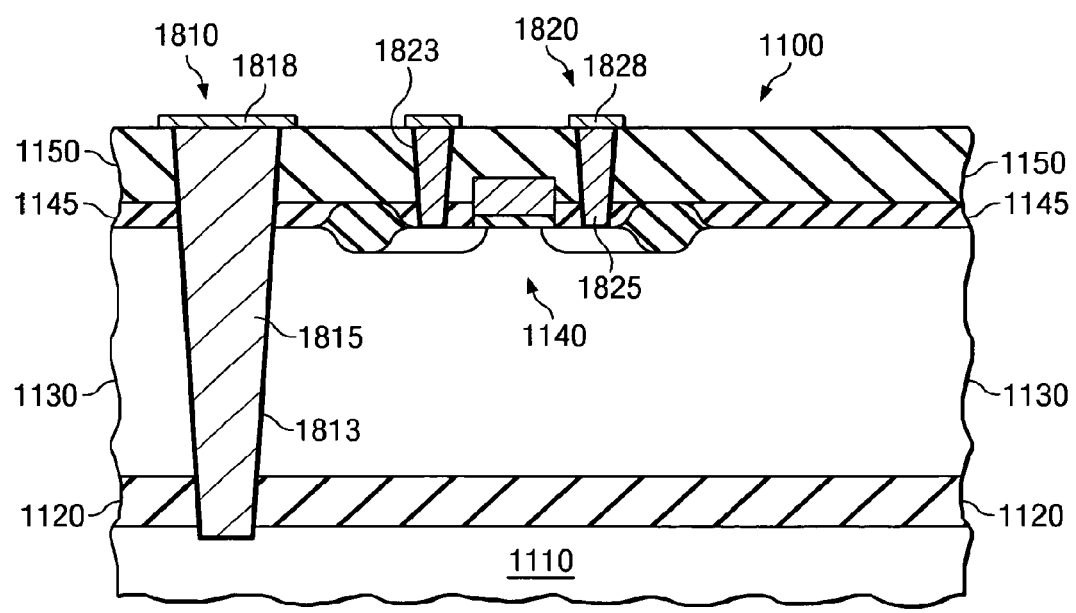
FIG. 18 illustrates a cross-sectional view of the partially completed integrated circuit illustrated in FIG. 17 after subjecting the blanket layer of conductive material to a conventional chemical mechanical polishing (CMP) process, thus resulting in an interconnect and a transistor device level contact.

Turning now to FIG. 18, illustrated is a cross-sectional view of the partially completed integrated circuit 1100 illustrated in FIG. 17 after subjecting the blanket layer of conductive material 1710 to a conventional chemical mechanical polishing (CMP) process, thus resulting in an interconnect 1810 and a transistor device level contact 1820 within the trench 1410 and openings 1520, respectively. What results are the interconnect 1810 and transistor device level contact 1820 having intermediate layers 1813, 1823, and conductive plugs 1815, 1825, respectively.

After completing the interconnect 1810 and transistor device level contact 1820, a blanket layer of conductive material could be deposited and patterned resulting in the first metal level features 1818 and 1828. Thereafter, another interlevel dielectric layer could be formed, and another metal level deposited thereon, and so on and so forth, until a completed integrated circuit was obtained.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit, comprising:
    forming a first dielectric layer over a wafer substrate;
    forming a semiconductor substrate over the first dielectric layer;
    forming a transistor device on or in the semiconductor substrate;
    forming one or more second dielectric layers over the transistor device;
    forming a metal feature positioned over the one or more second dielectric layers;
    forming a protective overcoat over the one or more second dielectric layers and over the metal feature;
    forming a hard mask layer over the protective overcoat;
    patterning the hard mask layer;
    forming a trench by etching the protective overcoat, and the one or more second dielectric layers, through the patterned hard mask layer;
    extending the trench through the semiconductor substrate and the first dielectric layer;
    patterning and etching the protective overcoat to form an opening to expose the metal feature; and
    forming conductive plugs within the trench and within the opening.

2. The method as recited in claim 1, further comprising forming an intermediate layer over the protective overcoat and within the trench and the opening; and masking the intermediate layer to cover the protective overcoat and leave the trench and the opening exposed; wherein forming the conductive plugs comprises forming the conductive plugs within the trench and within the opening, through the masked intermediate layer.

3. The method as recited in claim 2, wherein the intermediate layer comprises a seeding layer; and the conductive plugs comprise copper plugs formed using an electroplating process.

4. The method as recited in claim 3, wherein the seeding layer comprises at least one of titanium or tungsten.

5. The method as recited in claim 1, further comprising forming a TEOS layer over the semiconductor substrate and located, at least partially, over the transistor device; wherein forming the one or more second dielectric layers comprises forming the one or more second dielectric layers over the TEOS layer; and wherein forming the trench comprises forming the trench by etching the protective overcoat, the one or more second dielectric layers, and the TEOS layer through the patterned hard mask layer.

6. The method as recited in claim 1, wherein extending the trench through the semiconductor substrate and the first dielectric layer comprises etching the semiconductor substrate with a first etchant chosen to be selective to the semiconductor substrate and not to the first dielectric layer; and thereafter applying a second etchant to etch through the dielectric layer into the wafer substrate.

7. The method as recited in claim 1, wherein the wafer substrate is a p-type or n-type doped silicon substrate; the semiconductor substrate comprises a single crystal silicon substrate; the metal feature comprises copper; and the conductive plugs comprise copper.

8. The method as recited in claim 1, wherein the first dielectric layer comprises silicon dioxide; and the one or more second dielectric layers comprise low dielectric constant material.

9. The method as recited in claim 1, wherein the hard mask layer comprises at least one of nitride, silicon nitride or silicon oxynitride.

10. A method of manufacturing an integrated circuit, comprising:
    forming a first dielectric layer over a doped silicon wafer substrate;
    forming a silicon semiconductor substrate over the first dielectric layer;
    forming a transistor device on or in the semiconductor substrate;
    forming one or more second dielectric layers over the transistor device;
    forming a copper metal feature positioned over the one or more second dielectric layers;
    forming a protective overcoat over the one or more second dielectric layers and over the metal feature;
    forming a hard mask layer over the protective overcoat;
    patterning the hard mask layer;
    forming a trench by etching the protective overcoat, and the one or more second dielectric layers, through the patterned hard mask layer;
    extending the trench through the semiconductor substrate and the first dielectric layer;
    patterning and etching the protective overcoat to form an opening to expose the metal feature;
    forming a seeding layer over the protective overcoat and within the trench and the opening;
    masking the seeding layer to cover the protective overcoat and leave the trench and the opening exposed; and
    forming copper conductive plugs within the trench and within the opening, through the masked intermediate layer.

11. The method as recited in claim 10, further comprising forming a TEOS layer over the semiconductor substrate and located, at least partially, over the transistor device; wherein forming the one or more second dielectric layers comprises forming the one or more second dielectric layers over the TEOS layer; and wherein forming the trench comprises forming the trench by etching the protective overcoat, the one or more second dielectric layers, and the TEOS layer through the patterned hard mask layer.

12. The method as recited in claim 11, wherein extending the trench through the semiconductor substrate and the first dielectric layer comprises etching the semiconductor substrate with a first etchant chosen to be selective to the semiconductor substrate and not to the first dielectric layer; and thereafter applying a second etchant to etch through the dielectric layer into the wafer substrate.

13. The method as recited in claim 11, wherein the wafer substrate is a p-type or n-type doped silicon substrate and has a thickness of about 600 µm to about 700 µm; the first dielectric layer comprises a silicon dioxide buried oxide layer and has a thickness of about 100 µm to about 500 µm; the semiconductor substrate comprises a single crystal silicon substrate and has a thickness of about 7.5 µm to about 8.5 µm; the TEOS layer has a thickness of about 80 µM to about 200 µm; the one or more second dielectric layers comprise low dielectric constant material; the metal feature comprises copper; the protective overcoat comprises nitride, silicon nitride or silicon oxynitride and has a thickness of about 1.0 µm to about 2.0 µm; the hard mask layer comprises undoped silica glass; and the seeding layer comprises titanium tungsten alloy and has a thickness of about 250 nm to about 350 nm.

\* \* \* \* \*